US009210506B1

(12) United States Patent
Nawfal et al.

(10) Patent No.: US 9,210,506 B1
(45) Date of Patent: Dec. 8, 2015

(54) FFT BIN BASED SIGNAL LIMITING

(75) Inventors: Ismael Hamad Nawfal, Los Angeles, CA (US); Ramasamy Govindaraju Balamurali, Los Angeles, CA (US)

(73) Assignee: AUDYSSEY LABORATORIES, INC., Los Angeles, CA (US)

( * ) Notice: Subject to any disclaimer, the term of this patent is extended or adjusted under 35 U.S.C. 154(b) by 1122 days.

(21) Appl. No.: 13/230,686

(22) Filed: Sep. 12, 2011

(51) Int. Cl.
*H03G 3/00* (2006.01)
*H04R 3/04* (2006.01)

(52) U.S. Cl.
CPC ........................................ *H04R 3/04* (2013.01)

(58) Field of Classification Search
CPC ... G10L 21/0208; G10L 21/0232; H04R 3/04
USPC ........................................ 381/94.3, 94.8, 107
See application file for complete search history.

(56) References Cited

U.S. PATENT DOCUMENTS

| | | | | |
|---|---|---|---|---|
| 6,604,071 | B1 * | 8/2003 | Cox et al. | 704/225 |
| 7,013,011 | B1 * | 3/2006 | Weeks | H03G 9/025 381/107 |
| 2003/0179860 | A1 * | 9/2003 | Sun et al. | 379/67.1 |
| 2005/0149339 | A1 * | 7/2005 | Tanaka et al. | 704/500 |
| 2007/0083365 | A1 * | 4/2007 | Shmunk | 704/232 |
| 2009/0299742 | A1 * | 12/2009 | Toman | G10L 21/0272 704/233 |
| 2012/0179456 | A1 * | 7/2012 | Ryu et al. | 704/200.1 |

* cited by examiner

*Primary Examiner* — Alexander Jamal
(74) *Attorney, Agent, or Firm* — Kenneth L. Green; Averill & Green

(57) ABSTRACT

Volume extension includes limiting the magnitude of Fast Fourier Transform (FFT) frequency bins which allows increases to the perceived level of audio content without causing distortion. A soft limit and smoothing is applied to each FFT bin is to prevent or reduce distortion while maximizing output volume. Frequency resolution is significantly improved compared to volume extension methods utilizing filterbanks and hard limiting, and distortion is reduced because no hard limiting occurs.

5 Claims, 2 Drawing Sheets

FFT BIN BASED SIGNAL LIMITING

BACKGROUND OF THE INVENTION

The present invention relates to limiting the peaks in signals and in particular to limiting the magnitude of FFT bins to avoid harmonic distortion.

Known limiting utilizes filter banks and hard clipping to suppress problematic frequency bands created when increasing the playback level. The known approach has very limited resolution, and due to hard limiting of the signal, significant noise is often introduced.

BRIEF SUMMARY OF THE INVENTION

The present invention addresses the above and other needs by providing a volume extension method including limiting the magnitude of Fast Fourier Transform (FFT) frequency bins which allows increases to the perceived level of audio content without causing distortion. Soft limit and smoothing is applied to each FFT bin is to prevent or reduce distortion while allowing maximizing output volume. Frequency resolution is significantly improved compared to volume extension methods utilizing filterbanks and hard limiting, and distortion is reduced because no hard limiting occurs.

In accordance with one aspect of the invention, there is provided a method for signal processing audio signals. The method includes: receiving a time domain input signal; window the input signal; performing an FFT on the windowed signal to obtain FFT bin data; limiting the FFT bin data; performing an inverse FFT on the limited FFT bin data to obtain limited time domain data; assembling a limited signal from the limited time domain data; and driving an acoustic transducer with the limited signal to generate sound waves.

In accordance with a further aspect of the invention, there is provided a method for signal processing audio signals including applying a Hanning window to the input signal before performing an FFT.

In accordance with a further aspect of the invention, there is provided a method for signal processing audio signals including soft limiting FFT bin magnitudes. The magnitudes are mapped into limited magnitude values using an equation to reduce distortion.

In accordance with a further aspect of the invention, there is provided a method for signal processing audio signals including smoothing limited FFT bin magnitudes. After limiting individual FFT bin magnitudes, the frame to frame change in magnitude is further limited to reduce distortion. For example, a one pole filter may be applied after limiting.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Figure 1:
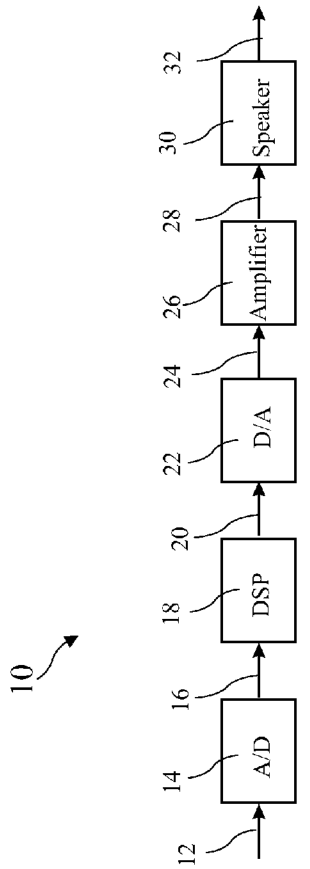
FIG. 1 is a functional diagram of an audio signal processing system including frequency domain limiting according to the present invention.

A functional block diagram of an audio signal processing system 10 including frequency domain limiting according to the present invention is shown in FIG. 1. The audio signal processing system 10 receives an analog signal 12, converts the analog signal 12 to a digital signal 16 in an Analog to Digital (ND) converter 14, processes the digital signal 16 in a Digital Signal Processor (DSP) 18 to provide a limited digital signal 20, processes the limited digital signal 20 in a Digital to Analog (D/A) converter 22 to create a limited analog signal 24, provides the limited analog signal 24 to an amplifier 26 to create an amplified signal 28, and provides the amplified signal 28 to a speaker 30 to create an audio signal 32 for a listener. In other embodiments a digital signal may be provided and the ND 14 is not required. Further, the A/D 14 and/or the D/A may be integrated into the DSP 18 as a single unit, and some speakers have amplifiers integrated into the speaker.

Figure 2:
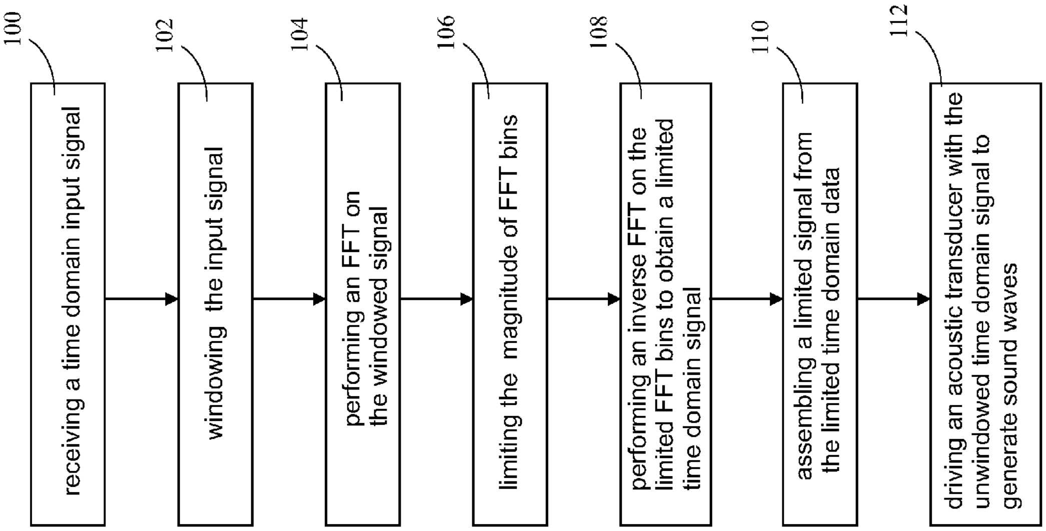
FIG. 2 is a method for frequency domain limiting according to the present invention.

A method for intelligent Fast Fourier Transform (FFT) frequency bin limiting according to the present invention is shown in FIG. 2. A time domain signal is received at step 100. The time domain signal may be a digital signal, or may be an analog signal converted into a digital signal before windowing. The digital time domain signal is windowed at step 102. The windowing preferably implements a Hanning function on N samples and is preferably 75 percent overlapped. An FFT is performed on the N windowed sample producing N complex values of N FFT bins at step 104. The N complex values are converted to magnitude and phase and the magnitude of each FFT bin is limited at step 106. After limiting, the limited magnitude and original phase of each bin are converted back into a complex value and an inverse FFT is performed to produce a frame of N limited time domain samples at step 108. The N limited time domain samples are assembled to produce a limited digital signal and the limited digital signal is converted into a limited analog signal at step 110. The limited analog signal, which is generally amplified, is provided to an acoustic transducer (e.g., a speaker) to provide an acoustic signal for a listener and step 112.

Figure 3:
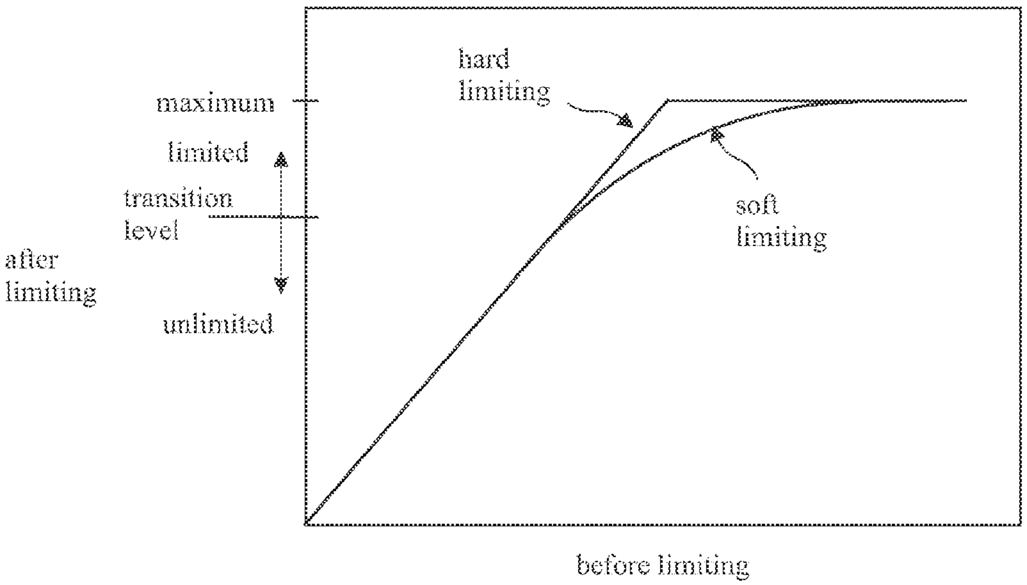
FIG. 3 is a soft limiting curve according to the present invention.

The limiting of step 106 may be a hard limiting which sets all values above the limit to the limit value, or a soft limiting as shown in FIG. 3. A soft limiting approach is more complex and comprises mapping a bin magnitude to a limiting curve using an equation. The soft limiting results in an unlimited region and a limited region above a transition level with varying degrees of limiting of bin magnitudes. Further, the limiting may include bin smoothing. An example of bin smoothing is a 1-pole filter with both an attack and release. The 1-pole filter smooths each bin from frame to frame (e.g., N parallel 1-pole filters). The bin smoother has a unique attack and release applied to each bin which may further reduce distortion. The bin smoothing has the effect of limiting the change in a given FFT bin magnitude from frame to frame and may also be seen as an extension of the limiting (basically adding time constants to the limiting). An example of the bin smoother has the form:

if MAG(n,m)>MAG_smoothed(n, m−1)

$$MAG\_smoothed(n,m)=\alpha*MAG(n,m)+(1-\alpha)*MAG\_smoothed(n,m-1) \text{ otherwise}$$

$MAG\_smoothed(n,m)=\beta*MAG(n,m)+(1-\beta)*MAG\_smoothed(n,m-1)$ where:

$MAG(n,m)$ is the limited magnitude in the $n^{th}$ FFT bin of the $m^{th}$ frame $MAG\_smoothed(n,m)$ is the smoothed output in the $n^{th}$ FFT bin of the $m^{th}$ frame $MAG\_smoothed(n,m-1)$ is the smoothed output in the nth FFT bin of the $m-1^{th}$ frame $\alpha$ is an attack smoothing coefficient $\beta$ is a release smoothing coefficient The inverse FFT data is preferably assembled by multiplying each frame (of size N) of inverse FFT data by the Hanning window, and adding the results to an accumulator (of size N). The first N/4 values in the accumulator are outputted as the first N/4 samples of the limited digital signal. After the first N/4 values are outputted, the data in the accumulator is shifted to the left by N/4 cells and the N/4 cells at the right end of the accumulator are set to zero. Then, the next frame of inverse FFT data is multiplied by the Hanning window and added to the existing N values in the accumulator, and the first N/4 values in the accumulator are again outputted as the second N/4 samples of the limited digital signal. This process is repeated as each frame of inverse FFT data is generated, windowed, and added to the accumulator to obtain a weighted average. The result is, weighted, and shifted by 0, N/4, 2N/4, and 3N/4, portions (of length N/4) of each FFT output frames, are summed together and outputted to obtain N/4 samples of the limited digital signal.

The FFT bin based signal limiting according to the present invention has application to music, television, movies, cell phones, and generally to any audio system where a desire exists to provide a high audio level without losing sound quality. Any audio system including FFT bin based signal limiting is intended to come within the scope of the present invention.

The digital signal sample rate is preferably 48K. The window length is generally matched to the FFT length N and a longer length FFT increases the frequency resolution of the FFT. Preferably, N is a power of two, and at least 256, and may be as high as 2048 in software based systems, but is constrained by the processing environment. Implementations in DSPs are limited by existing processors to about 512.

The FFT output is conjugate symmetric, meaning that the first half of the output is equal to the reversed order conjugate of the second half. Thus, if the FFT produces N complex values, N/2 of the values describe the spectrum of the signal.

While the invention herein disclosed has been described by means of specific embodiments and applications thereof, numerous modifications and variations could be made thereto by those skilled in the art without departing from the scope of the invention set forth in the claims.

We claim:

1. A method for signal processing audio signals, the method comprising: receiving a time domain input signal; windowing the input signal; performing an FFT on the windowed signal to obtain complex FFT bin data; converting the complex FFT bin data into magnitude and phase FFT bin data; limiting the magnitude of the FFT bin data, wherein limiting the FFT bin data comprises selecting a limit value and setting all values above the limit value to the limit value; converting the limited magnitude and phase FFT bin data into limited complex FFT bin data; performing an inverse FFT on the limited complex FFT bin data to obtain limited time domain data; assembling a limited signal from the limited time domain data; and driving an acoustic transducer with the limited signal to generate sound waves.

2. A method for signal processing audio signals, the method comprising:

receiving a time domain input signal;

windowing the input signal using a Hanning window and 75 percent overlap;

performing an FFT on the windowed signal to obtain complex FFT bin data;

converting the complex FFT bin data into magnitude and phase FFT bin data;

limiting the magnitude of the FFT bin data using soft smoothing;

smoothing the limited magnitude of the FFT bin data, converting the limited and smoothed magnitude and phase FFT bin data into limited and smoothed complex FFT bin data;

performing an inverse FFT on the limited and smoothed complex FFT bin data to obtain limited time domain data;

applying the Hanning window to the limited time domain data;

adding the windowed limited time domain data to an accumulator;

taking the left most N/4 values in the accumulator to obtain N/4 samples of a limited signal;

shifting the values in the accumulator N/4 paces to the left;

setting the N/4 right most values in the accumulator to zero;

converting the limited signal to a limited analog signal;

amplifying the limited analog signal; and driving an acoustic transducer with the amplified limited signal to generate sound waves for a listener.

3. The method of claim 1, wherein:

the limited time domain data comprises a frame of inverse FFT data of size N; and assembling a limited signal from the limited time domain data comprises:

shifting values in an accumulator of size N, M samples to the left;

setting the M right most values in the accumulator to zero;

adding the limited time domain data to the accumulator;

taking the left most M values in the accumulator to obtain M samples of the limited signal; and repeating the shifting, setting, adding, and taking to obtain another M samples of the limited signal.

4. The method of claim 3, wherein M is equal to N/4.

5. The method of claim 4, wherein driving an acoustic transducer with the limited signal to generate sound waves comprises:

converting the limited signal to a limited analog signal; and driving an acoustic transducer with the limited signal to generate sound waves for a listener.

* * * * *